(12) United States Patent
Fang et al.

(10) Patent No.: US 8,272,124 B2
(45) Date of Patent: Sep. 25, 2012

(54) ANCHORING CARBON NANOTUBE COLUMNS

(75) Inventors: Treliant Fang, Dublin, CA (US); Michael Harburn, San Ramon, CA (US); Onnik Yaglioglu, Oakland, CA (US)

(73) Assignee: FormFactor, Inc., Livermore, CA (US)

( * ) Notice: Subject to any disclaimer, the term of this patent is extended or adjusted under 35 U.S.C. 154(b) by 682 days.

(21) Appl. No.: 12/418,438

(22) Filed: Apr. 3, 2009

(65) Prior Publication Data

US 2010/0253375 A1 Oct. 7, 2010

(51) Int. Cl.
*B81C 1/00* (2006.01)
*H01R 13/02* (2006.01)

(52) U.S. Cl. ............... 29/842; 29/874; 29/876; 29/877; 29/884; 174/256

(58) Field of Classification Search .............. 29/842, 29/874, 876, 877, 883, 884, 885; 174/250, 174/257
See application file for complete search history.

(56) References Cited

U.S. PATENT DOCUMENTS

| | | | |
|---|---|---|---|
| 5,998,864 A | 12/1999 | Khandros et al. | |
| 6,020,747 A | 2/2000 | Bahns et al. | |
| 6,232,706 B1 | 5/2001 | Dai et al. | |
| 6,346,189 B1 | 2/2002 | Dai et al. | |
| 6,401,526 B1 | 6/2002 | Dai et al. | |
| 6,457,350 B1 | 10/2002 | Mitchell | |
| 6,597,090 B1 | 7/2003 | Mancevski | |
| 6,626,684 B1 | 9/2003 | Stickler et al. | |
| 6,627,980 B2 | 9/2003 | Eldridge | |
| 6,800,865 B2 | 10/2004 | Nakayama et al. | |
| 6,863,942 B2 | 3/2005 | Ren et al. | |
| 6,882,546 B2 | 4/2005 | Miller | |
| 6,890,506 B1 | 5/2005 | Harutyunyan et al. | |
| 6,920,689 B2 | 7/2005 | Khandros et al. | |
| 6,921,575 B2 * | 7/2005 | Horiuchi et al. | 428/367 |
| 6,933,222 B2 | 8/2005 | Dubin et al. | |
| 6,945,827 B2 | 9/2005 | Grube et al. | |
| 6,967,013 B2 | 11/2005 | Someya et al. | |
| 6,979,244 B2 | 12/2005 | Den et al. | |
| 7,012,441 B2 | 3/2006 | Chou et al. | |
| 7,082,683 B2 | 8/2006 | Han et al. | |
| 7,094,123 B2 | 8/2006 | Oyama et al. | |
| 7,132,039 B2 | 11/2006 | Anasawa et al. | |
| 7,147,966 B2 | 12/2006 | Ren et al. | |
| 7,160,531 B1 | 1/2007 | Jacques et al. | |
| 7,189,430 B2 | 3/2007 | Ajayan et al. | |
| 7,226,663 B2 | 6/2007 | Jiao et al. | |
| 7,250,188 B2 | 7/2007 | Dodelet et al. | |

(Continued)

FOREIGN PATENT DOCUMENTS

EP 1830367 9/2007

(Continued)

OTHER PUBLICATIONS

U.S. Appl. No. 12/632,428, filed Dec. 7, 2009, Eldridge et al.

(Continued)

*Primary Examiner* — Derris Banks
*Assistant Examiner* — Kaying Kue
(74) *Attorney, Agent, or Firm* — Kirton & McConkie

(57) ABSTRACT

A technique for anchoring carbon nanotube columns to a substrate can include use of a filler material placed onto the surface of the substrate into area between the columns and surrounding a base portion of each of the columns.

15 Claims, 11 Drawing Sheets

U.S. PATENT DOCUMENTS

| | | | |
|---|---|---|---|
| 7,251,884 B2 | 8/2007 | Grube et al. | |
| 7,258,901 B1 | 8/2007 | Lee et al. | |
| 7,342,403 B2 * | 3/2008 | Chen | 324/755.07 |
| 7,378,328 B2 | 5/2008 | Choi et al. | |
| 7,400,159 B2 | 7/2008 | Wang et al. | |
| 7,566,410 B2 * | 7/2009 | Song et al. | 252/511 |
| 7,585,548 B2 | 9/2009 | Wang et al. | |
| 7,641,938 B2 * | 1/2010 | Liu et al. | 427/249.1 |
| 7,749,801 B2 * | 7/2010 | Choi et al. | 438/95 |
| 7,850,874 B2 * | 12/2010 | Lu et al. | 252/510 |
| 7,923,527 B1 * | 4/2011 | Yang et al. | 528/351 |
| 8,021,747 B2 * | 9/2011 | Yi et al. | 428/304.4 |
| 8,048,322 B2 * | 11/2011 | Yao et al. | 216/2 |
| 8,057,901 B2 * | 11/2011 | Ford et al. | 428/408 |
| 2003/0010910 A1 | 1/2003 | Colbert et al. | |
| 2003/0153965 A1 | 8/2003 | Supronowicz et al. | |
| 2003/0179559 A1 | 9/2003 | Engelhardt et al. | |
| 2004/0036403 A1 | 2/2004 | Ouo et al. | |
| 2004/0110003 A1 | 6/2004 | Cumings et al. | |
| 2004/0113621 A1 | 6/2004 | Naughton | |
| 2004/0208788 A1 | 10/2004 | Colton | |
| 2005/0019245 A1 | 1/2005 | Koulikov | |
| 2005/0285116 A1 | 12/2005 | Wang | |
| 2006/0028220 A1 | 2/2006 | Malantonio et al. | |
| 2006/0071334 A1 | 4/2006 | Kawabata et al. | |
| 2006/0073089 A1 | 4/2006 | Ajayan et al. | |
| 2006/0076690 A1 | 4/2006 | Khandros et al. | |
| 2006/0085976 A1 | 4/2006 | Eldridge et al. | |
| 2006/0103406 A1 | 5/2006 | Kitazawa et al. | |
| 2006/0188721 A1 | 8/2006 | Irvin et al. | |
| 2006/0197547 A1 | 9/2006 | Chen | |
| 2006/0198956 A1 | 9/2006 | Eres | |
| 2006/0252853 A1 | 11/2006 | Ajayan et al. | |
| 2006/0290343 A1 | 12/2006 | Crafts et al. | |
| 2007/0004191 A1 | 1/2007 | Gu et al. | |
| 2007/0018098 A1 | 1/2007 | Nakayama et al. | |
| 2007/0051887 A1 | 3/2007 | Hidaka et al. | |
| 2007/0138010 A1 * | 6/2007 | Ajayan | 204/400 |
| 2007/0155158 A1 | 7/2007 | Gstrein et al. | |
| 2007/0158584 A1 | 7/2007 | Lin | |
| 2007/0158697 A1 * | 7/2007 | Choi et al. | 257/246 |
| 2007/0158768 A1 | 7/2007 | Pilchowski et al. | |
| 2007/0164214 A1 | 7/2007 | Choi et al. | |
| 2007/0186665 A1 | 8/2007 | Hierold et al. | |
| 2007/0213419 A1 | 9/2007 | Cao et al. | |
| 2007/0215841 A1 * | 9/2007 | Ford et al. | 252/503 |
| 2007/0218202 A1 | 9/2007 | Ajayan et al. | |
| 2007/0235713 A1 | 10/2007 | Swirbel | |
| 2007/0237990 A1 | 10/2007 | Kim | |
| 2007/0290394 A1 * | 12/2007 | Furukawa et al. | 264/154 |
| 2008/0088219 A1 * | 4/2008 | Yoon et al. | 313/326 |
| 2008/0277719 A1 * | 11/2008 | Choi et al. | 257/324 |
| 2008/0290326 A1 * | 11/2008 | Merkulov et al. | 252/502 |
| 2009/0032496 A1 * | 2/2009 | Yao et al. | 216/58 |
| 2009/0066352 A1 * | 3/2009 | Gritters et al. | 324/755 |
| 2009/0091343 A1 | 4/2009 | Wu et al. | |
| 2009/0197082 A1 * | 8/2009 | Jiang et al. | 428/367 |
| 2009/0197484 A1 * | 8/2009 | Chen et al. | 439/884 |
| 2010/0044225 A1 * | 2/2010 | Kim et al. | 204/403.15 |
| 2010/0078618 A1 * | 4/2010 | Xiao et al. | 257/3 |
| 2010/0083489 A1 * | 4/2010 | Eldridge et al. | 29/825 |
| 2010/0096619 A1 * | 4/2010 | Cheong et al. | 257/20 |
| 2010/0112828 A1 * | 5/2010 | Eldridge et al. | 439/66 |
| 2010/0127358 A1 * | 5/2010 | Tanaka | 257/656 |
| 2010/0252317 A1 * | 10/2010 | Gritters et al. | 174/261 |

FOREIGN PATENT DOCUMENTS

| | | |
|---|---|---|
| EP | 1845124 | 10/2007 |
| WO | WO 00/73204 | 12/2000 |
| WO | WO 03/004155 | 1/2003 |
| WO | WO 2004/102582 | 11/2004 |
| WO | WO 2005/017977 | 2/2005 |
| WO | WO 2006/057659 | 6/2006 |
| WO | WO 2007/033188 | 3/2007 |
| WO | WO 2007/139244 | 12/2007 |
| WO | WO 2008/024726 | 2/2008 |
| WO | WO 2008/048938 | 4/2008 |

OTHER PUBLICATIONS

Yaglioglu et al., "Conductive Carbon Nanotube Composite Micro-Probes," Advanced Materials (2008), 20, pp. 357-362.

U.S. Appl. No. 11/466,039, filed Aug. 21, 2006, Eldridge.

U.S. Appl. No. 12/418,368, filed Apr. 3, 2009, Gritters et al.

U.S. Appl. No. 12/259,915, filed Oct. 28, 2008, Khandros et al.

U.S. Appl. No. 12/421,805, filed Apr. 10, 2009, Chen et al.

Moloni et al., "Sharpened Carbon Nanotube Probes" (University of Wisconsin-Madison) (no date but downloaded from Internet on Sep. 6, 2007).

Pushparaj et al., "Effects of compressive strains on electrical conductivities of a macroscale carbon nanotube block," Applied Physics Letters 91, 153116 (2007).

Yaglioglu et al., "Conductive Carbon Nanotube Composite Micro-Probes," Nanoletters.

Yaglioglu et al., "Transfer and Reinforcement of Carbon Nanotube Structures with Epoxy," Precision Engineering Research Group, Dept. of Mechanical Engineering, Massachusetts Institute of Technology (presented at NTOG conference in Japan, Jun. 2006).

Yaglioglu, "Carbon Nanotube Based Electromechanical Probes," Thesis (Massachusetts Institute of Technology Jun. 2007).

Andrews et al., "Continuous production of aligned carbon nanotubes: a step closer to commercial realization," Chemical Physics Letters 303 (Apr. 16, 1999), pp. 467-474.

Greene, "Researchers Make Carbon Nanotubes Without Metal Catalyst," MIT News (Aug. 10, 2009) (2 pages).

* cited by examiner

ANCHORING CARBON NANOTUBE COLUMNS

BACKGROUND

The present invention relates generally to apparatus and methods for using and making carbon nanotube columns attached to a substrate.

Carbon nanotube columns have the potential to be useful in a number of applications. For example, carbon nanotube columns can be used as contact elements in electronic systems. Carbon nanotube columns can provide desirable properties, such as for example, high stiffness, toughness, resilience, electrical conductivity.

Unfortunately, numerous challenges to effective application of carbon nanotube columns remain.

SUMMARY

In accordance with some embodiments of the present invention a method for anchoring carbon nanotube columns is provided. The method can include providing a substrate with a plurality of carbon nanotube columns attached to a surface of the substrate. A filler material can be deposited on the surface to surround each of the columns. The filler material and columns can be planarized by removing first portions of the filler material and first portions of the columns. A second portion of the filler material can be etched away to expose second (tip) portions of the columns, leaving third (base) portions of the columns anchored in the filler material.

In some embodiments of the present invention an electronic device with anchored carbon nanotube columns is provided. The electronic device can include a substrate and a plurality of carbon nanotube columns attached to a surface of the substrate. The carbon nanotube columns can extend from the surface of the substrate with a length. A filler material can be disposed on the substrate filling area on the surface of the substrate between the columns. The filler material can have a thickness that is less than three quarters of the length of the carbon nanotube columns.

In some embodiments of the present invention a probe card assembly comprising anchored carbon nanotube columns is provided. The probe card assembly can include an electrical interface to a tester, and a substrate. A plurality of electrical paths through the probe card assembly can provide for electrical connection between the electrical interface to the tester and probes arranged to contact terminals an electronic device to be tested. The electrical paths can include carbon nanotube columns. The carbon nanotube columns can include a base attached to a surface of the substrate, a length of the column extending from the surface, and a filler material disposed on the surface filling area between the columns, wherein a thickness of the filler material is less than three quarters of the length of the columns.

BRIEF DESCRIPTION OF THE DRAWINGS

FIG. 3A is a side cross-sectional illustration of a substrate having carbon nanotube columns attached thereto.

FIG. 3B is a side cross-sectional illustration showing a dam and filler material placed onto the device of FIG. 3A.

FIG. 3C is a side cross-sectional illustration of the substrate showing material removed from the device of FIG. 3B during a planarizing operation.

FIG. 3D is a side cross-sectional illustration of the substrate after the planarizing operation of FIG. 3C.

FIG. 3E is a side cross-sectional illustration after removal of a portion of the filler material form the device of FIG. 3D.

FIG. 5A is a side cross-sectional illustration showing transfer of anchored carbon nanotube columns from a first substrate to a second substrate.

FIG. 5B is a side cross-sectional illustration showing the transferred carbon nanotube columns on the second substrate.

FIG. 5C is a side cross-sectional illustration showing the transferred carbon nanotube columns after removal of excess bonding material.

FIG. 5D is a side-cross sectional illustration showing anchored carbon nanotube columns on the second substrate.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As introduced above, various challenges to the use of carbon nanotube columns exist. For example, vertically aligned carbon nanotube columns can be grown on a substrate using various techniques. The grown carbon nanotube columns can, however, have weak adhesion to the substrate. The application of a lateral force (or other perturbation) can cause the carbon nanotube columns to lose touch with the substrate and tip over. Accordingly, strengthening of the attachment of the carbon nanotube columns to the substrate is desirable.

In some embodiments of the invention, methods for anchoring carbon nanotube columns to a substrate are provided. For example, the carbon nanotube columns can be anchored using an etchable fill material. The etchable fill material can be a wet etchable fill material. The anchored columns can have improved adhesion properties and thus withstand application of lateral forces in use. For example, anchored columns can be useful in probe cards and other electronics applications.

Figure 1:
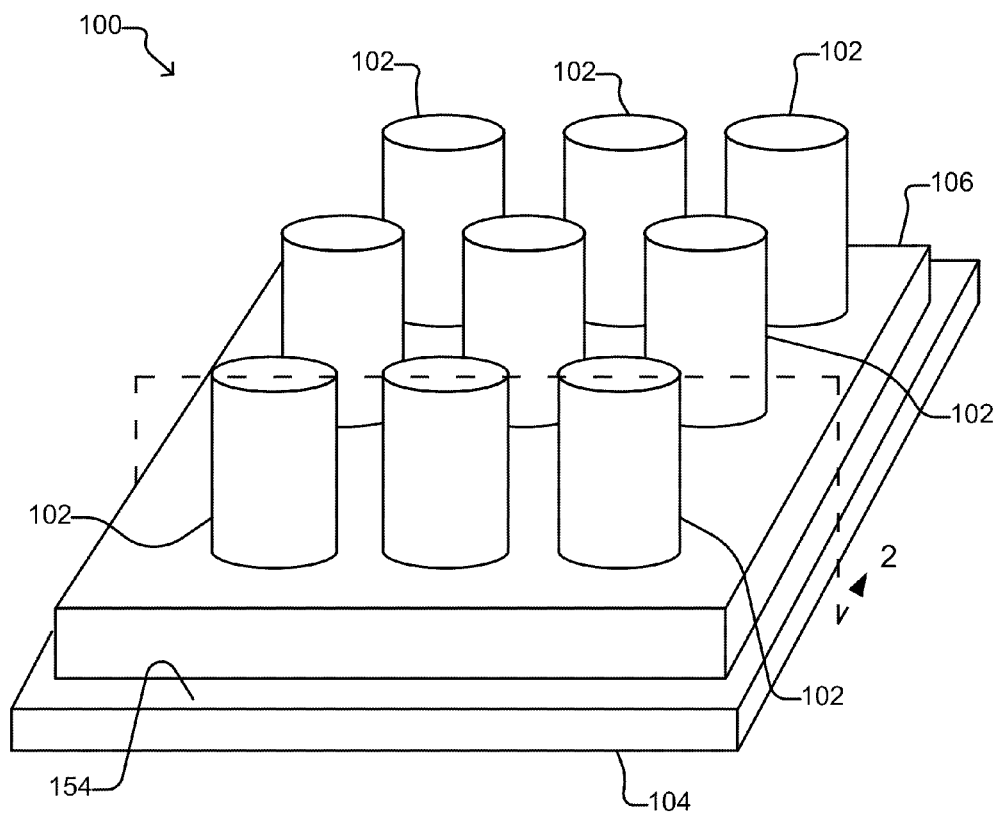
FIG. 1 is a perspective illustration of an electronic device according to some embodiments of the invention.
Figure 2:
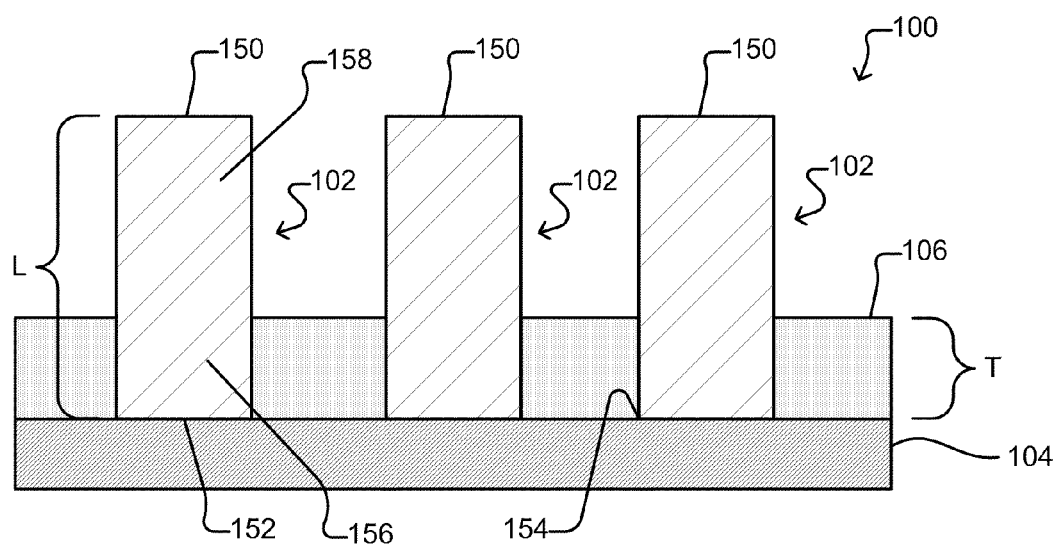
FIG. 2 is a cross-sectional illustration of the electronic device of FIG. 1 taken along line 2.

FIGS. 1 and 2 illustrate an electronic device incorporating anchored carbon nanotube columns in accordance with some embodiments of the present invention. The device, shown generally at 100, can include a plurality of carbon nanotube columns 102 disposed on a substrate 104. The substrate can be of various materials, and include one or more layers of materials. For example, the substrate can be a printed circuit board, semiconductor device, or the like, and examples are described further below.

The carbon nanotube columns 102 can comprise a plurality of individual carbon nanotubes. Carbon nanotubes can be fiber-like structures, and can be intertwined in a mass. The carbon nanotubes that compose a column 102 can bend and/or twist and thus be intertwined one with another. Accordingly, each column 102 can comprise numerous individual carbon nanotubes intertwined into a mass to form the structure of the column 102. For example, columns 102 can each comprise few (e.g., tens) or many (e.g., thousands or hundreds of thousands) of individual nanotubes.

An individual carbon nanotube can have a number of attributes including without limitation the following: the number of walls and the thickness of the wall(s) of the carbon nanotube, the diameter of the carbon nanotube, and the chirality (rolling angle) of the carbon nanotube. In addition, a group of carbon nanotubes intertwined to form a structure like columns 102 can have a number of attributes including without limitation the following: the average spacing between individual carbon nanotubes in the group, the average length of the carbon nanotubes in the group, and the alignment or orientation of the carbon nanotubes in the group.

The carbon nanotubes in each of columns 102 are not limited to having any particular number of walls, thickness of the walls, diameter, or chirality, nor are the carbon nanotubes that form a column 102 limited to a particular average spacing between carbon nanotubes, average length, or alignment.

In some embodiments, the carbon nanotube columns 102 can comprise vertically aligned carbon nanotubes. A column comprising vertically aligned carbon nanotubes can be termed a "vertically aligned" carbon nanotube column. Any of the carbon nanotube columns described herein, including without limitation columns 102, can be vertically aligned.

As used herein, a column (e.g., column 102) of carbon nanotubes is "vertically aligned" if most (i.e., 50% or more) of the carbon nanotubes that compose the column form a continuous path along a length of the column that start at one end of the column and end at an opposite end. In some embodiments, a greater percentage than 50% of the carbon nanotubes in a column can be vertically aligned. For example, in some embodiments, 60%, 70%, 75%, 80%, 90%, 95%, 98%, 99%, or a greater percentage of the carbon nanotubes that compose a column 102 can be vertically aligned. In some embodiments, a single carbon nanotube can comprise a plurality of tubes that are grown directly one atop the other resulting in a continuous path.

While the columns are described herein as columns of carbon nanotubes, other types of electrical contacts can be similarly anchored. The columns can include other material in addition to the carbon nanotubes. For example, the columns can include a low modulus elastomer, which can modify the mechanical behavior of the columns. The columns can include a binder material, which can help maintain the mechanical integrity of the columns.

As seen best in FIG. 2, the carbon nanotube columns can have a length of L measured from a base end 152 to a tip end 150. Base ends 152 of the carbon nanotube columns 102 can rest on the substrate 152, and can be anchored by a filler material 106 disposed around the base ends 152 of the carbon nanotube columns 102. The filler material 106 can be disposed in a layer of thickness T, in which case base portions 156 of the carbon nanotube columns 102 can be embedded in the filler material. The filler material 106 can be bonded to the surface 154 of the substrate 104 and, if desired, to the base portions 156. In other words, the base portions 156 can be embedded in the filler material 106. The filler material 106 can fill substantially all of the area on the surface of the substrate 104 between the columns 102. The filler material 106 can surround the base portions 156 and fill area on the surface of the substrate between the columns. A tip portion 158 of the columns 102 can protrude above the filler material 106

Various thicknesses T of the filler material 106 can be used. For example, the thickness T can be less than about three quarters of the length L of the carbon nanotube columns. As another example, the thickness T can be less than half of the length L, less than one third, or less than one quarter of the length L.

Although the carbon nanotube columns 102 are shown as having a circular cross section, the columns are not limited to this shape and can have any suitable cross section geometry. For example, the columns can have triangular, square, rectangular, multi-sided, oval, ring (or doughnut), or other cross sectional shapes. Furthermore, the carbon nanotube columns need not all have the same shape.

Figure 3A:
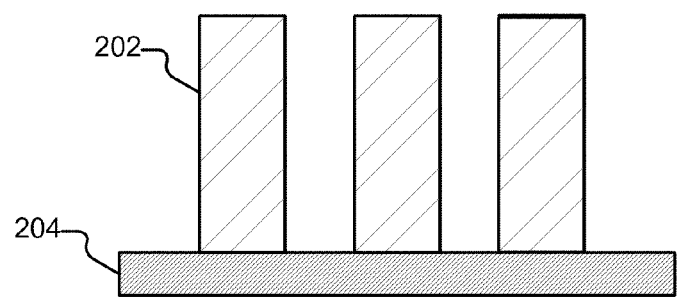
FIGS. 3A-3E illustrate various operations in a process of anchoring carbon nanotube columns according to some embodiment of the invention.

In accordance with some embodiments of the invention, a process of anchoring carbon nanotube columns will now be described in conjunction with FIGS. 3A-3E. A first operation is to provide a substrate with carbon nanotube columns attached to a surface of the substrate. For example, FIG. 3A illustrates a substrate 204 having a plurality of columns 202 attached thereto. Substrate 204 can be like substrate 104 described above, and columns 202 can be like columns 102 described above. As alluded to above, the carbon nanotube columns may be only weakly attached to the substrate.

For example, in some embodiments, the carbon nanotube columns can be grown on the substrate. Non-limiting examples of suitable substrates 204 include a semiconductor wafer, a ceramic substrate, a substrate comprising an organic material, a substrate comprising an inorganic material, or combinations thereof. The substrate 204 can be a product substrate on which the carbon nanotube columns 202 will be used in their final application, or the substrate 204 can be an intermediate substrate from which the carbon nanotube columns 202 will later be transferred.

Various ways of growing carbon nanotube columns can be used, including any suitable known or future developed process. As an example, the substrate 204 can include growth medium portions (not shown) on which the carbon nanotubes are grown. For example, growth medium portions can be exposed portions of a growth material layer (not shown) exposed through holes in a masking layer (not shown). As another example, growth material (not shown) can be deposited on the substrate 204, and then patterned to create growth medium portions. Patterning of growth material or masking layers can be performed using various techniques, such as for example, photolithography. The growth medium portions can be any material suitable for growing carbon nanotube columns. For example, growth medium portions can be material with an oxide film or material on which an oxide film can be formed so that growth medium portions comprise an oxide. For example, growth medium portions can comprise an oxide film on a silicon material. As another example, growth medium portions can comprise quartz.

As another example, in some embodiments, the carbon nanotube columns can be grown (e.g., on a growth substrate) and then transferred to the substrate. For example, carbon nanotube columns can be grown on a temporary processing substrate (not shown), adhesive applied to tips of the carbon distal from the substrate, and then the adhesive-covered tips brought into contact with the substrate to transfer the carbon nanotube columns to substrate 204. Although such carbon nanotube columns may be more strongly attached to substrate 204 than carbon nanotube columns grown in place on substrate 204, anchoring can still be helpful in providing an even stronger attachment.

Following the providing of the substrate with carbon nanotube columns attached thereto, the process can include depositing a filler material onto the surface of the substrate and surrounding the columns. Various ways of depositing a filler material onto the surface can be used. For example, the filler material may be applied directly to the surface of the substrate. As another example, a dam can be provided to form a reservoir and filler material applied into the reservoir. Various ways of making the dam can be used. For example, a photosensitive thixotropic polymer can be applied using a pressurized dispenser. A brief exposure to ultraviolet light can cure the dam.

Figure 3B:
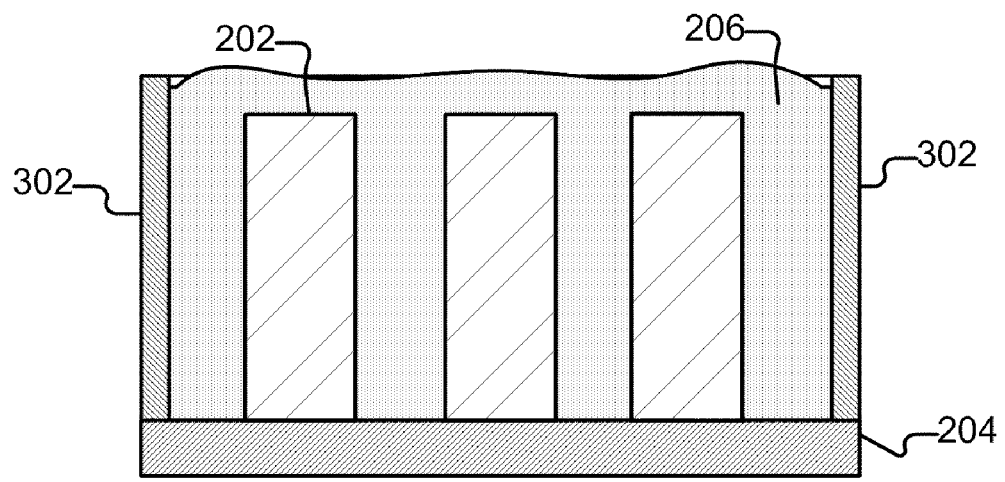

FIG. 3B shows a dam 302 placed on the substrate 204. Although the filler material is shown completely covering the substrate, the dam can be placed on just a portion of the substrate, if desired. Alternatively, the dam 302 can be placed around the substrate 204. Filler material 206 can be deposited into the dam, onto the surface of the substrate, and surrounding the columns 202. Filler material 206 can be like filler material 106 described above.

The filler material 206 can hold the columns 202 because the columns are captured in the filler material. If desired, although not necessary, the filler material 206 can adhere or otherwise form a bond to the substrate 204, and can adhere or otherwise form a bond to the base portions of the columns 202. For example, the filler material can wick or infiltrate partially into the columns to form a mechanical bond. As another example, the filler material can form a chemical or electrostatic bond to the substrate and/or columns.

Various types of filler material can be used. In general, the filler material can be a wet etchable lapping material. By "wet etchable" is meant a material than can be etched away in a wet etching processing. By "lapping material" is meant a material that is suitable for use in a lapping process, for example, as described further below. For example, the filler material 206 can be a liquid that is poured into the reservoir created by the dam 302 and substrate 202 and then hardened or cured. Curing can be performed by various ways, including for example: heating the filler material, allowing the filler material to be exposed to ambient air for a particular period of time, exposing the filler material to ultraviolet light, or any other suitable manner. During the hardening, the filler material can also be bonded to the surface of the substrate and the carbon nanotube columns. Various materials can be used as the filler material.

For example, the filler material can be an acrylic polymer. More particularly, the filler material can be a wet etchable acrylic polymer.

The filler material 206 is shown in FIG. 3B as completely surrounding and encasing the columns, although this is not essential. In other words, the height of the dam 302 can be above the columns (so that the columns are completely encased in the filler material) or below the columns (so that a portion of the columns are left exposed).

Figure 3C:
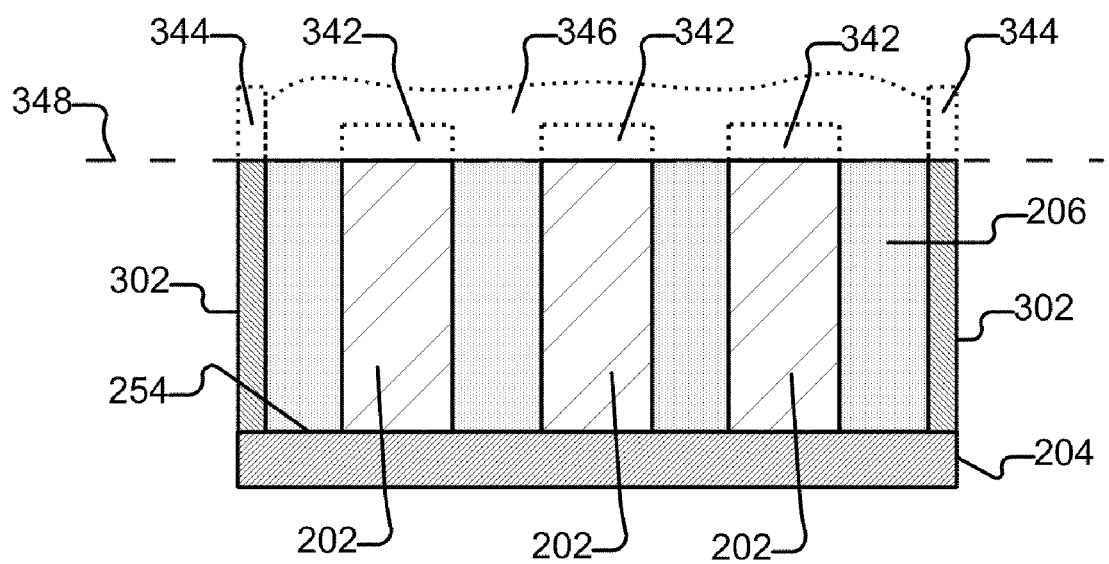

The filler material 206 and the columns 202 can then be planarized as shown in FIG. 3C by removing a first portion 346 of the filler material 206 and portions 342 of the columns 202. For example, planarizing can be performed by lapping, chemical-mechanical polishing, or similar techniques. It will be appreciated that a portion 344 of the dam 302 can also be removed during the planarizing.

In some embodiments, the planarizing can be performed with respect to a surface of the substrate. For example, planarizing can be performed on a plane 348 that is substantially parallel to the upper surface 254 of the substrate 204. In such a case, the resulting length of the columns will be substantially equal.

Figure 3D:
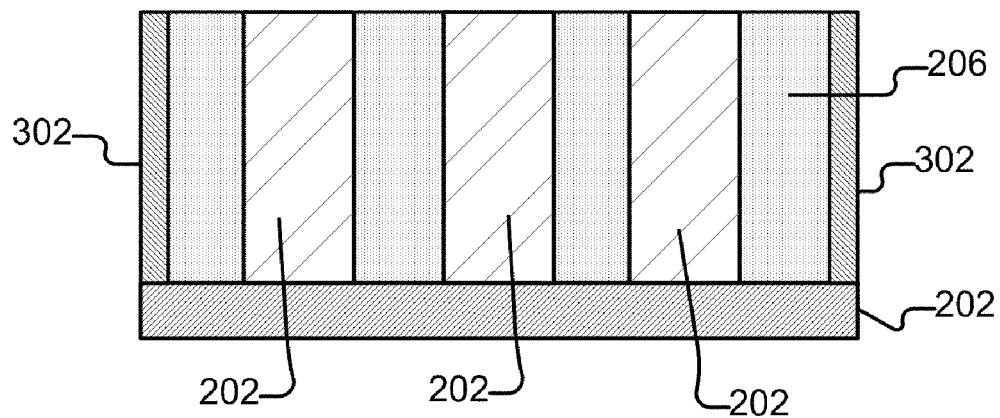

FIG. 3D illustrates the result after the planarizing has been performed. Planarization can be performed using very accurate (low tolerance) processes. For example, in some embodiments, the resulting planarized surface can be planar to within about plus or minus one micron (micrometer). If desired, other levels of accuracy can be provided. Accordingly, the resulting lengths of the carbon nanotube columns 202 remaining after the planarizing can be substantially equal, or within the tolerance of the planarizing. Various measurements and specification of the accuracy can be used (e.g., root-mean-square surface accuracy, peak deviation, etc.).

Figure 3E:
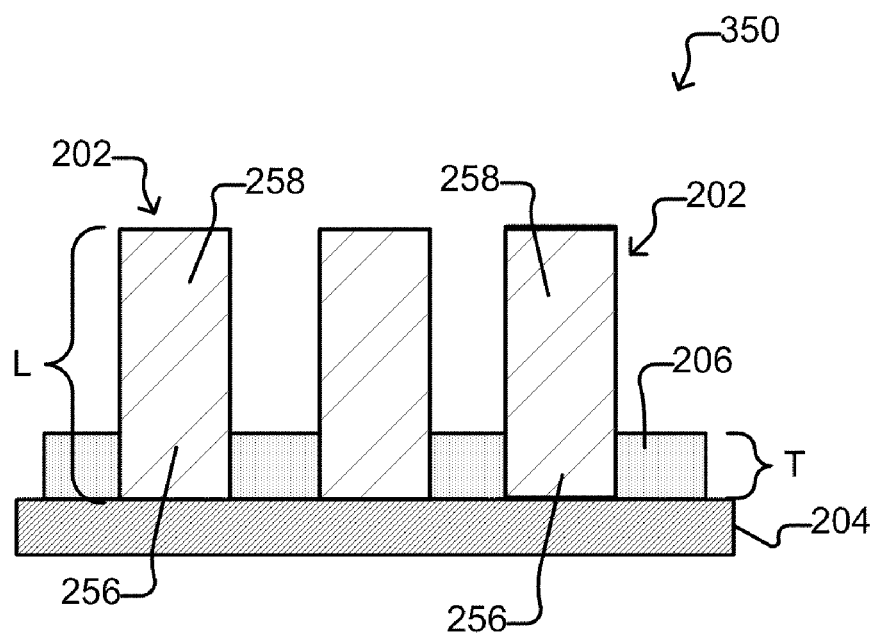

Another operation in the process can include removing a second portion of the filler material. For example, as shown in FIG. 3E, a second portion of the filler material 206 can be removed by etching, thereby exposing a tip portion 258 of the columns while a base portion 256 of the columns remains embedded in a third portion of the filler material 206 that remains after the etching. As mentioned above, the third portion of the filler material can be bonded to the surface of the base portion 256 of the columns 202 and to the substrate 204, thereby enhancing the attachment of the columns 202 to the substrate 204.

Various etching techniques can be used to remove the second portion of the filler material 206. For example, wet etching can be performed using a solvent that removes or dissolves the filler material 206. The amount of filler material removed can be a function of the etching time, with longer etching times causing more material to be removed. Accordingly, the thickness T of the remaining third portion of the filler material 206 can be any desired thickness, including for example: less than three quarters of the length L of the columns, less than one half, less than one third, and less than one quarter, or other thicknesses desired.

The dam can also be removed, for example, after the planarizing, during the wet etching, or after the wet etching. In the finished assembly, shown generally at 350, the resulting carbon nanotube columns 202 are more securely attached or anchored to the substrate 204 as a result of the filler material 206 holding the carbon nanotube columns 202 and being attached to the surface of the substrate 204. This enhanced attachment can be advantageous in various situations.

In some embodiments, the carbon nanotube columns 202 can be disposed on a substrate 204 that is an electronic device and the carbon nanotube columns 202 can be used as electrical connections to the electronic device. The enhanced attachment can make it less likely that the carbon nanotube columns become separated from the substrate during use.

In some embodiments, the anchored carbon nanotube columns 202 can be used in a subsequent process, wherein the substrate 204 is only used temporarily. The enhanced attachment can help to ensure the carbon nanotube columns remain attached to the substrate until deliberately released during the subsequent process. For example, as described further below, the anchored carbon nanotube columns can be transferred to a second substrate.

Figure 4:
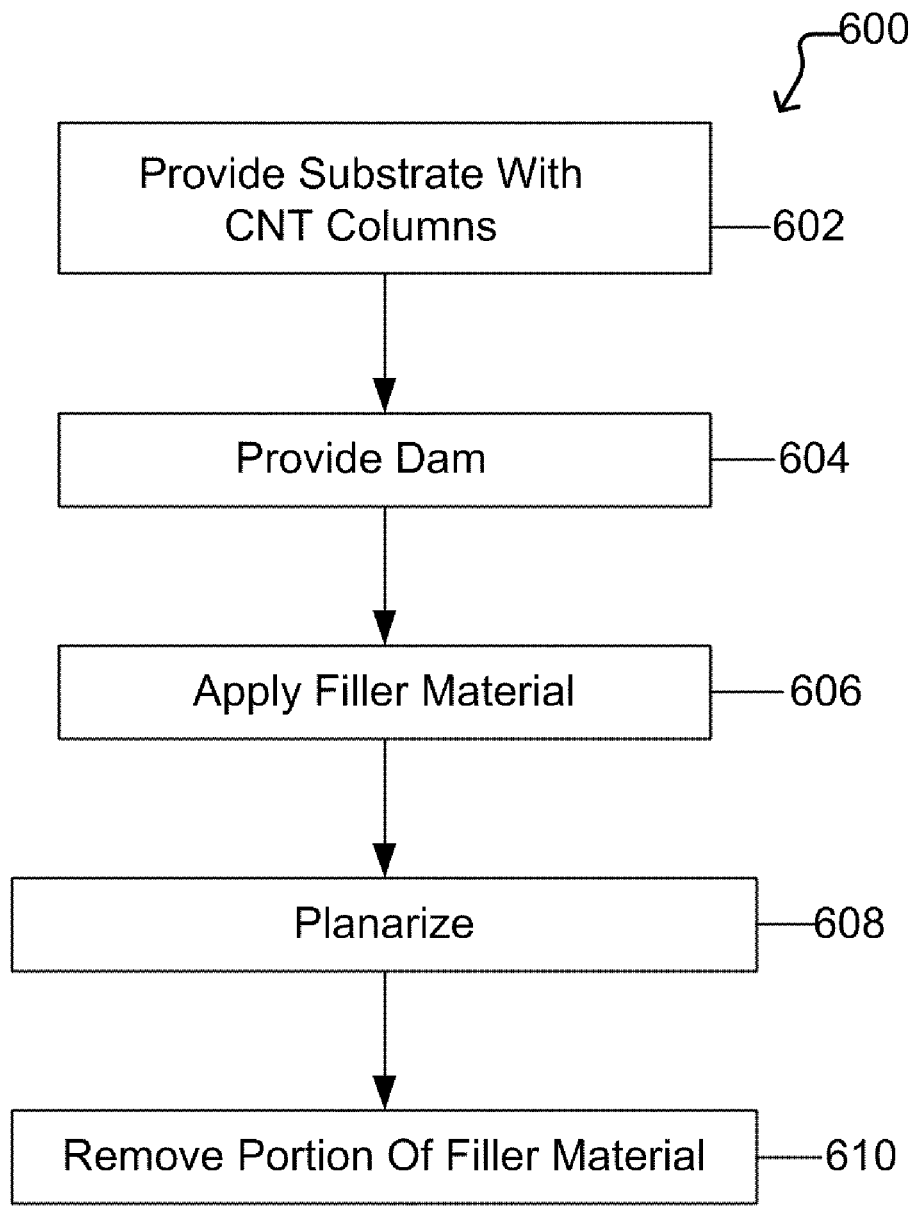
FIG. 4 is a flow chart of a process for anchoring carbon nanotubes in accordance with some embodiments of the invention.

FIG. 4 provides a flow chart of a process 600 for anchoring carbon nanotube columns similar to the examples just provided. The process 600 can include providing a substrate with carbon nanotube columns attached thereto at block 602. For example, as described above, the carbon nanotube columns can be transferred to the substrate or grown on the substrate.

Another operation in the process 600 can be to provide a dam at block 604. For example, the dam 604 can be place around, on, or on a portion of the substrate, as described above. At block 606 a filler material can be applied. For example, filler material can be poured into the reservoir created by the dam, as described above.

The process 600 can also include a planarizing operation at block 608. For example, the upper, exposed surface of the filler material and carbon nanotube columns can be processed to form a plane as described above.

At block 610, a portion of the filler material can be removed. For example, filler material can be removed by wet etching, as described above.

In accordance with some embodiments of the invention, a process of transferring anchored carbon nanotube columns to a second substrate will now be described in conjunction with FIGS. 5A-5D. The process can start with a first substrate 404 having carbon nanotube columns 402 attached there to and secured by filler material 406. There can be exposed ends 450 of the carbon nanotube columns 402 extending out of the filler material 406.

For example, the carbon nanotube columns 402 can be like carbon nanotube columns 102, 202, the first substrate 404 can be like substrates 104, 204, and the filler material can be like filler material 102, 206. The carbon nanotube columns 402, first substrate 404, and filler material 406 can be provided using processes similar to those described above.

Figure 5A:
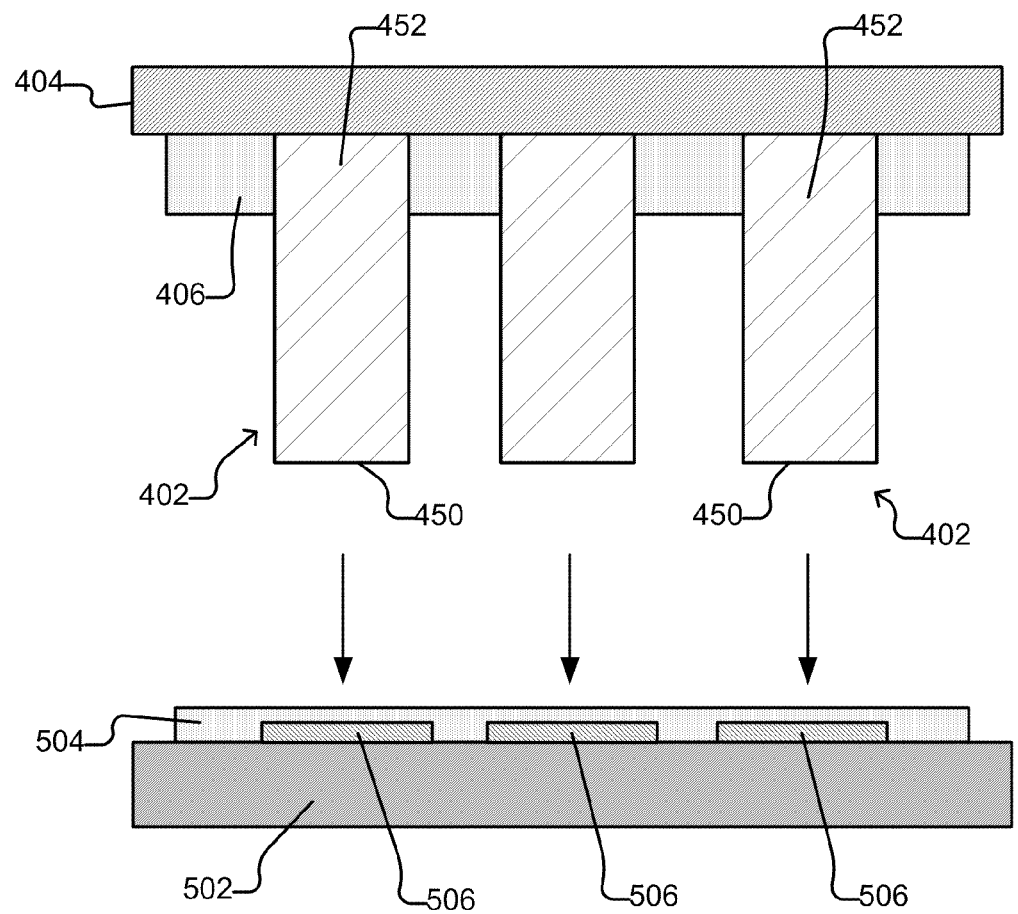
FIGS. 5A-5D illustrate various operations in a process of anchoring carbon nanotube columns according to some embodiment of the invention.

A second substrate 502 having terminals 506 is also provided. Second substrate 502 can be like substrate 104, 204, 404. The process can include attaching the carbon nanotube columns 402 to the second substrate 502. For example, as illustrated in FIG. 5A, bonding material 504 can be disposed on the terminals 504 of the second substrate 502. For example, bonding material 504 can be deposited on the entire upper surface (e.g., by spin coating, spray coating, etc.) as shown, or alternatively, bonding material can be deposited just on the terminals 504 (e.g., by screen sprinting, stenciling, etc.). The first substrate 404 and the second substrate 502 can be brought together, so that ends 450 of the carbon nanotube columns 402 contact the bonding material 504. The bonding material can be cured. For example, curing can be performed by heating the bonding material, allowing the bonding material to be exposed to ambient air for a particular period of time, exposing the bonding material to ultraviolet light, or any other suitable manner. The bonding material can bond to the carbon nanotube columns 402 and the terminals 506. For example, the bonding material 504 can wick or infiltrate partially into the columns 404, terminals 506, and/or substrate 502 to form a mechanical bond. As another example, the bonding material 504 can form a chemical or electrostatic bond. If desired, the bonding material 504 can be an electrically conductive material, including for example conductive epoxy (e.g., an epoxy containing particulars of a conductive material, such as silver, copper, gold, etc.).

Alternatively, the bonding material can be applied to the ends 450 of the carbon nanotube columns 402, and then the substrates 404, 502 brought together. Or, if desired, bonding material can be applied to both the ends 450 of the carbon nanotube columns 402 and to the terminals 506.

Figure 5B:
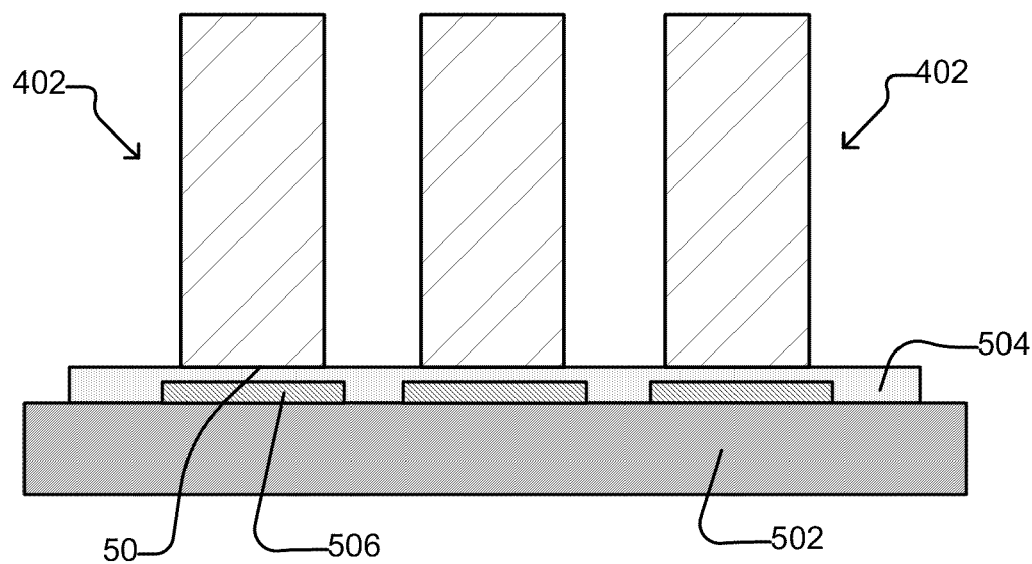

After the ends 450 of the carbon nanotube columns 402 have been attached to the terminals 506 of the second substrate 502, the carbon nanotube columns 402 can be released from the filler material 406 and the first substrate 404 as shown in FIG. 5B. For example, the carbon nanotube columns 402 can be released by peeling away, dissolving, or otherwise separating the carbon nanotube columns 402 from the filler material 406 and first substrate 404. For example, separating can be caused by applying a solution to dissolve the filler material and release the columns. As another example, separating can be caused by application of a mechanical or thermal shock. As another example, the bonding material can be selected to provide a stronger bond between the ends 450 of the columns 402 attached to terminals 506 than the bond between the ends 452 of the columns 402 anchored to the first substrate 404 and filler material 406, so that the columns 402 remain attached to the terminals 506 and separate from the first substrate 404 when the first substrate 204 and second substrate 502 are pulled apart. As another example, a thermal shock can be applied by subjecting any or all of the columns 402, first substrate 404, and/or filler material 406 to a rapid temperature change. As a particular example, a thermal shock can be applied by impinging a rinse solution onto the columns 402, first substrate 404, and/or filler material 406.

Figure 5C:
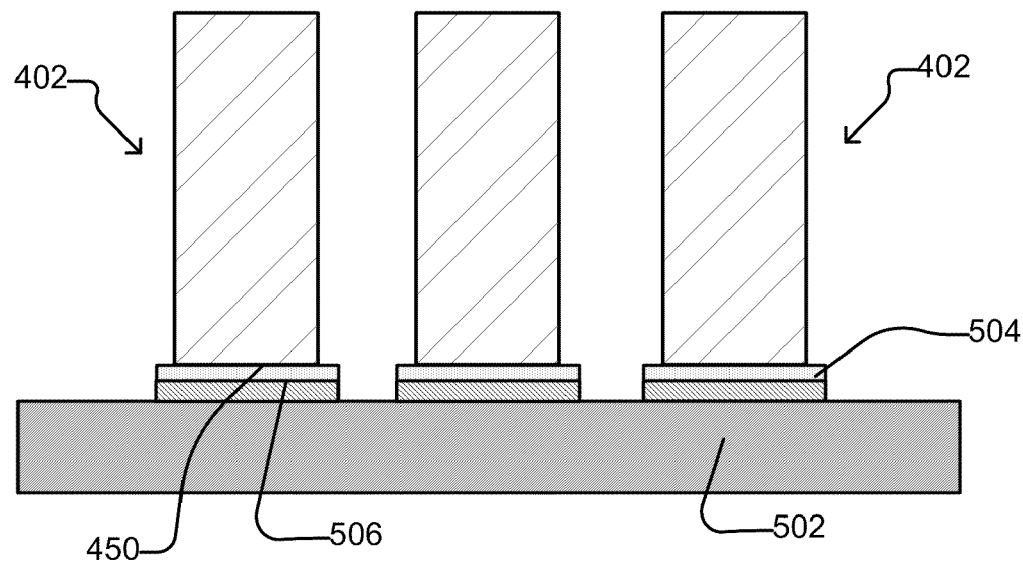

If desired or necessary, excess bonding material can be removed, as shown in FIG. 5C. For example, excess bonding material can be removed by dissolving or etching.

Figure 5D:
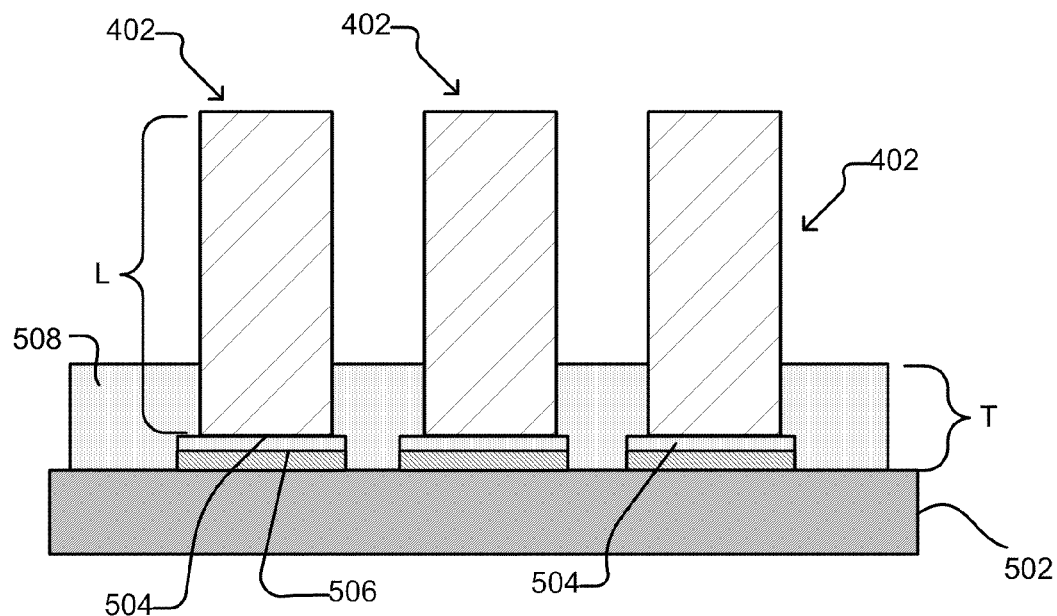

Another operation in the process can be to anchor the carbon nanotube columns 402 to the second substrate 502 as shown in FIG. 5D. For example, the carbon nanotube columns can be anchored using a process similar to that described. After being anchored, the carbon nanotube columns 402 can have ends 450 attached to the second substrate 502 by bonding material 506 and surrounded by second filler material 508. The second filler material can be like filler material 102, 206, 406 described above and applied using similar techniques as described above (e.g., FIGS. 3A-3E and 4).

In some embodiments, one benefit of the process just described is that ends 450 of the carbon nanotube columns 450 can be more securely attached to the terminals 506 in part because the ends can be highly planar (having been planarizing during the process of being anchored).

In some embodiments, carbon nanotube columns 402 can be disposed on a substrate 502 that is an electronic device and the carbon nanotube columns 402 can be used as electrical connections to the electronic device. The enhanced attachment can make it less likely that the carbon nanotube columns become separated from the substrate during use.

Figure 6:
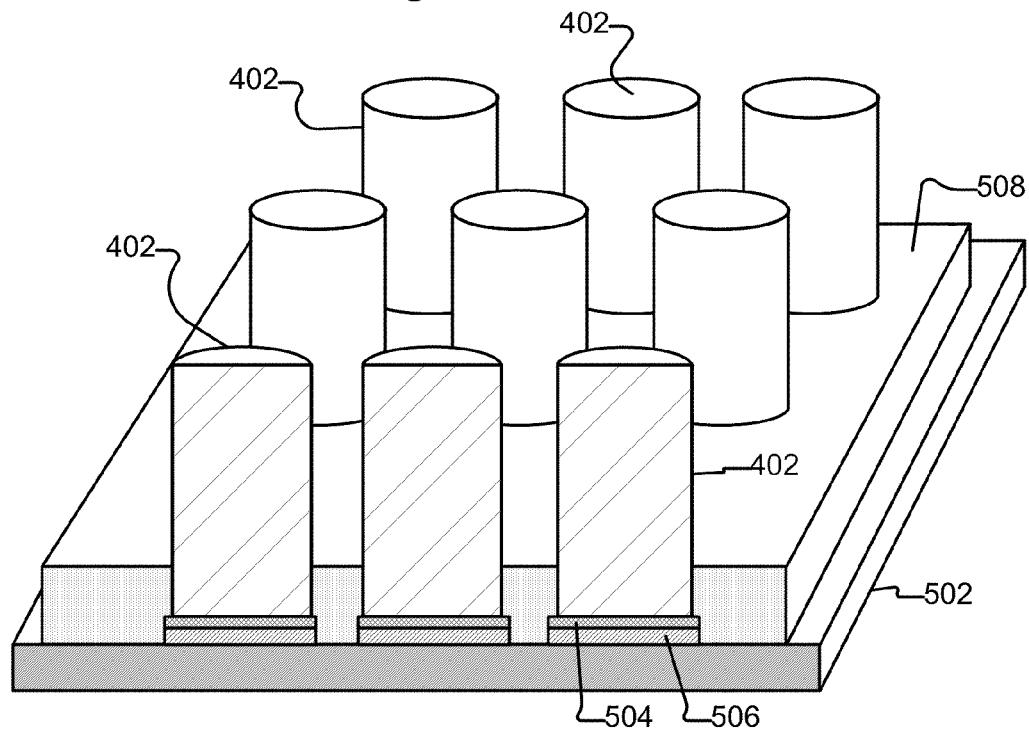
FIG. 6 is a partially sectioned perspective illustration of anchored carbon nanotube columns in accordance with some embodiments of the invention.
Figure 6:
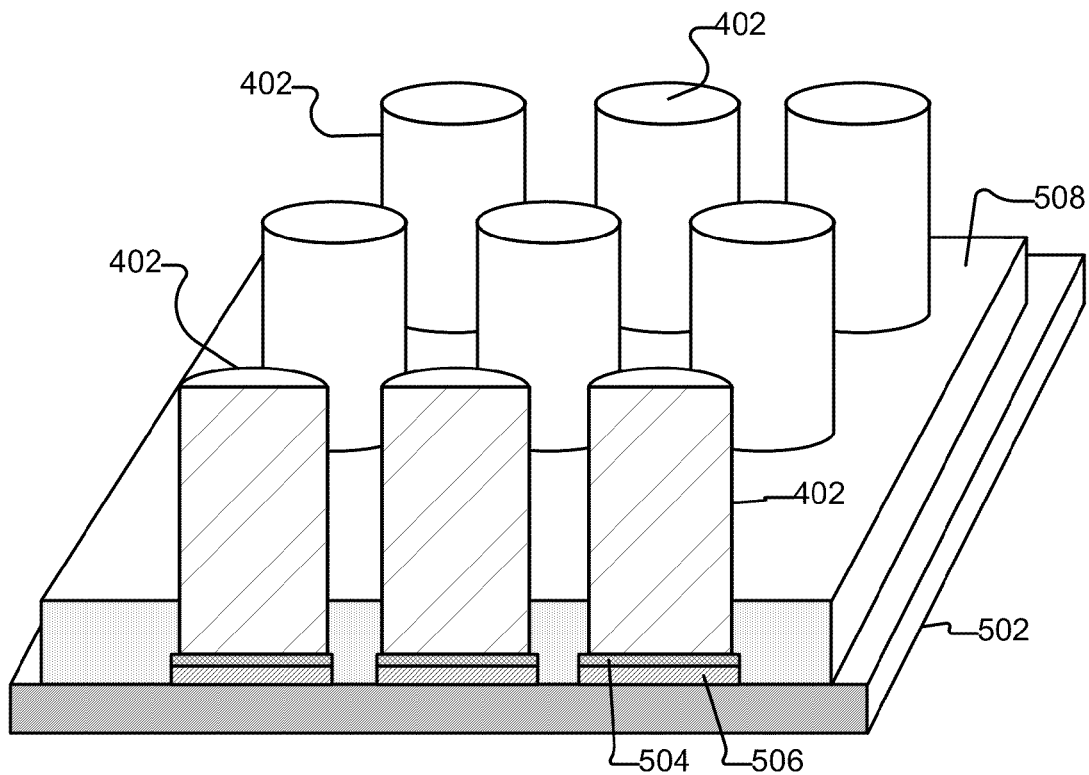

FIG. 6 shows a partially sectioned perspective view of a finished assembly 550 that can, for example, be made using a process as just described. The finished assembly can therefore include a substrate 502 and a plurality of carbon nanotube columns 402. The carbon nanotube columns 402 can be attached to terminals 506 of the substrate by a bonding material 504 and a filler material 408. The filler material 408 can extend partway up the columns 402, so that a portion (e.g., three fourths, half, a third, or a quarter) of the columns 402 are embedded in the filler material 408.

Figure 7:
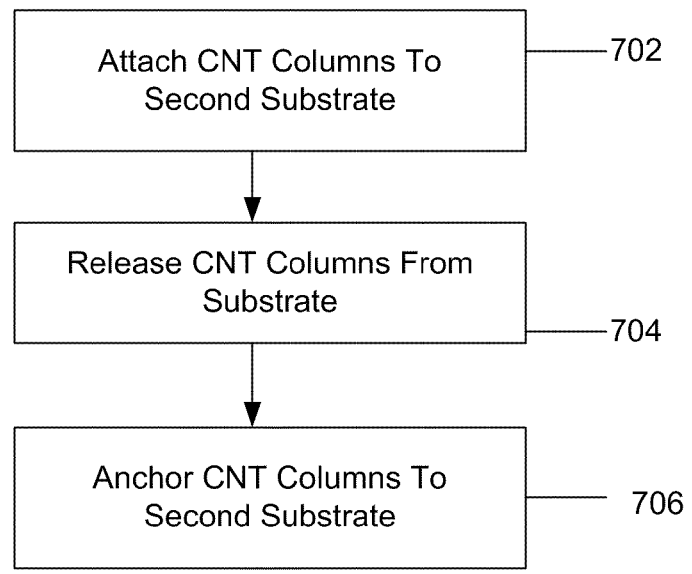
FIG. 7 is a flow chart of a process for anchoring carbon nanotube columns in accordance with some embodiments of the invention.

FIG. 7 provides a flow chart of a process 700 for transferring and anchoring carbon nanotube columns similar to the examples just provided. The process 700 can use two substrates, a temporary substrate carrying carbon nanotube columns and a second substrate to which the carbon nanotube columns are to be attached. A first operation at block 702 can be to attach the carbon nanotube columns to the second substrate. For example, the carbon nanotube columns can be attached using an adhesive or bonding material as described above. Once attached, at block 704 the carbon nanotube columns can be released from the temporary substrate. At block 706, the carbon nanotube columns can be anchored to the second substrate. For example, various techniques for anchoring carbon nanotube columns such as described above can be used.

Figure 8:
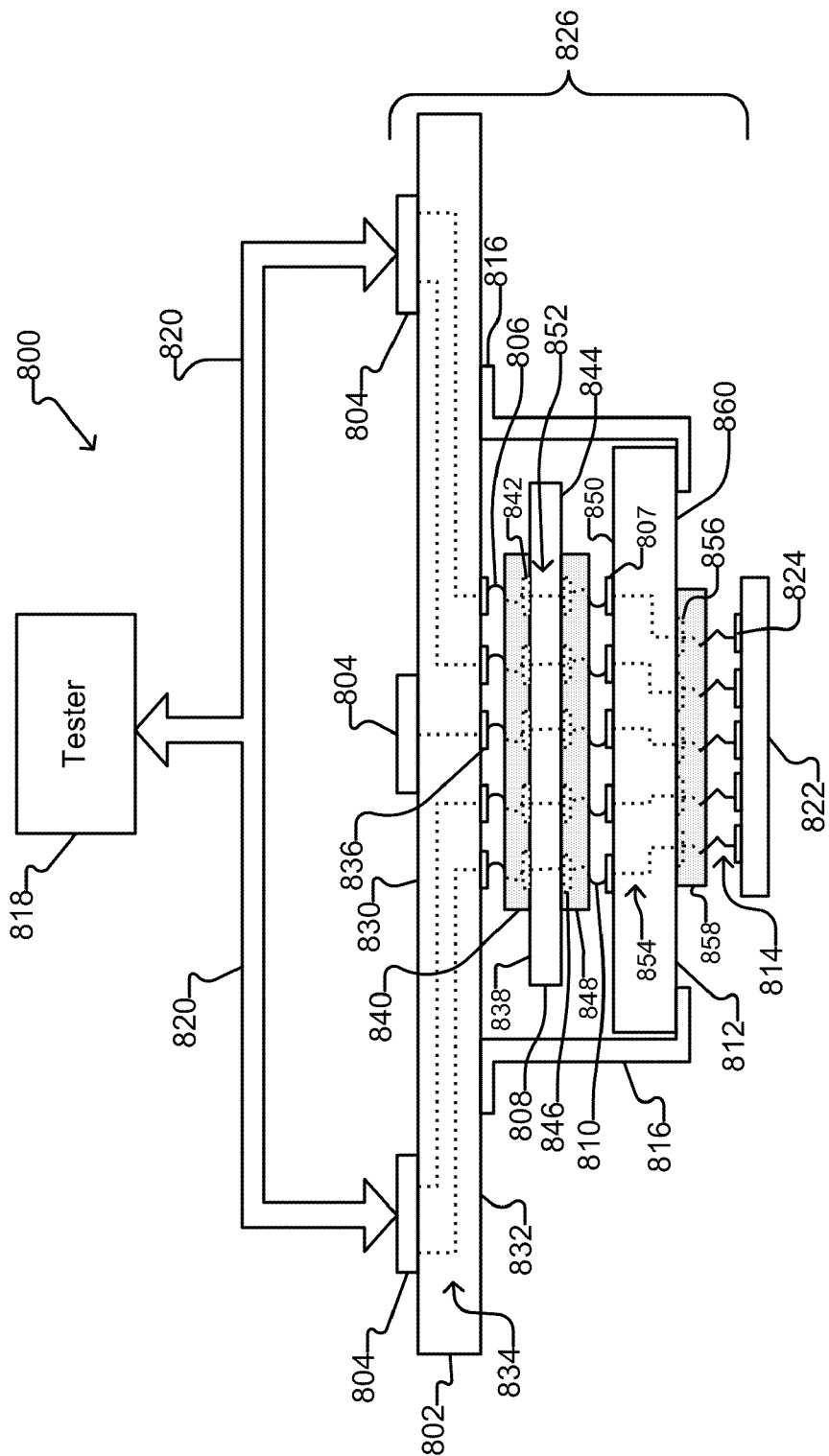
FIG. 8 is a block diagram of a test system in accordance with some embodiments of the invention.

As mentioned above, anchored carbon nanotube columns can be used as electrical contacts in various applications. For example, FIG. 8 illustrates a test system 800 in which a probe card assembly 826 includes anchored carbon nanotube columns in accordance with some embodiments of the invention. As shown, test system 800 can include a tester 818 configured to control testing of one or more DUTs 822. The acronym "DUT" can mean "device under test," which can be any electronic device including without limitation semiconductor dies (singulated or in wafer form, packaged or unpackaged). A plurality of communications channels 820 and probe card assembly 826 can provide a plurality of electrical paths for power, ground, test, response, and other signals between tester 818 and DUT 822. For example, first ends of electrical paths can be connected to electrical interface 804 and second ends of the electrical paths can be configured to contact terminals 824 of the DUT 822. Various types of electrical interfaces 804 can be used, including for example, zero insertion force connectors, pogo pins, or any other suitable interface for communicating electrical signals.

Tester 818 can test DUT 822 by generating test signals that are provided through communications channels 820 and probe card assembly 826 to ones (i.e., one, two, many, or all) of terminals 824 of DUT 822. The tester 818 can evaluate response signals generated by DUT 822 in response to the test signals. The response signals can be sensed at ones of terminals 824 of DUT 822 and provided to the tester 818 through probe card assembly 828 and communications channels 820. A DUT can be tested to produce a tested device.

Tester 818 can comprise electronic control equipment such as one or more computers or computer systems. Probe card assembly 826 can comprise an electrical interface 804 to the tester 818 via communications channels 820. Probe card assembly 826 can also comprise electrically conductive spring probes, which can be anchored carbon nanotube columns 814 anchored by filler material 858. The carbon nanotube columns 814 can have a layout corresponding generally to the layout of the terminals 824 of the DUT 822, so that the carbon nanotube columns 814 can make temporary pressure electrical connections from the probe card assembly 826 to the terminals 824 when brought into contact with the terminals. For example, portions of carbon nanotube columns 814 not encased in the filler material 858 can provide a resilient spring-like character. Electrical connections from the tester 818 can therefore be made through electrical interface 804, conductors 834 (e.g., traces, vias), other portions of the probe card assembly (described further below), to carbon nanotube columns 814.

DUT 822 can be one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and any other suitable type of electronic device or devices. As is known, a semiconductor die can comprise a semiconductor material into which an electric circuit is integrated, and terminals 824 can be bond pads or other contact features that provide electrical connections to and from the electric circuit.

The probe card assembly 826 can include various subassemblies, such as a wiring substrate 802, interposer 808, probe substrate 812, or other assemblies. While the probe card assembly 826 is shown with a wiring substrate 802, interposer 808 and probe substrate 812, not all of these assemblies need be included. For example, the interposer 808 and probe substrate 812 can be omitted, and probes 814 provided directly on the wiring substrate 802. As another alternative, interposer 808 can be omitted and flexible wiring or other interconnections can be provided. As yet another example, the interposer 808 can be omitted and the probe substrate 812 can be coupled directly to the wiring substrate 802.

The wiring substrate 802 can be a semi-rigid printed circuit board having the electrical interface 804 on a first surface 830 and pads 836 on a second surface 832. Alternatively, the wiring substrate 802 can be rigid (e.g., a multilayer ceramic substrate). The probe substrate 812 can be a rigid wiring substrate (e.g., a multilayered ceramic) or a semi-rigid substrate (e.g., a printed circuit board). Electrical connections between the subassemblies can use anchored carbon nanotube columns. For example, the interposer can include first carbon nanotube columns 806 disposed on a first surface 838, anchored in filler material 840, and arranged to contact pads 836 on wiring substrate 802. The interposer can also include second carbon nanotube columns 810 disposed on a second surface 844, anchored in filler material 848, and arranged to contact pads 807 on probe substrate 812. Carbon nanotube columns 806, 810 can be disposed on terminals 842, 846 of the interposer 808, and corresponding terminals 842, 846 electrically interconnected by conductors 852 (e.g., traces, vias). The carbon nanotube columns 806, 810 can provide resilient electrical connections. For example, probe substrate 812 can be attached to wiring substrate 802 by brackets 816, and interposer 808 held in place between by pressure applied to the anchored carbon nanotube columns 806, 810 by corresponding pads 836, 807.

As mentioned above, probe substrate 812 can include carbon nanotube columns 814 anchored in filler material 858. Carbon nanotube columns 814 can be disposed on pads 856 on a second surface 860 of the probe substrate 812. Pads 856 can be electrically connected by conductors 854 (e.g., traces, vias) to pads 807 on a surface 850 of the probe substrate 812.

As mentioned above, carbon nanotube columns 806, 810, 814 can be anchored carbon nanotube columns. For example, carbon nanotube columns 806, 810, 814 can be similar to carbon nanotube columns 102, 202, 402 and made using any process described herein (e.g., FIG. 4, FIG. 7).

In accordance with some embodiments, a probe card assembly need not include all of the subassemblies illustrated in FIG. 8. For example, in some embodiments, carbon nanotube columns 814 can be disposed and anchored directly onto pads 836 of wiring substrate 802, in which case interposer 808 and probe substrate 812 can be omitted.

In accordance with some embodiments, positions of the anchored carbon nanotube columns can be moved to the opposite surface. For example, carbon nanotube columns 814 can be anchored to DUT 822 and make pressure contact with pads 856. As another example, carbon nanotube columns 838 can be anchored to surface 832 of wiring substrate 802 and make pressure contact with pads 842, and carbon nanotube columns 810 can be anchored to surface 850 of probe substrate 812 and make pressure contact with pads 846. Accordingly, many other arrangements and variations of a probe card assembly will now be apparent.

In some embodiments, carbon nanotube columns 806, 810, 814 can provide desirable spring properties. For example, the portion of carbon nanotube columns 806, 810, 814 extending above filler material 840, 848, 858 can act like a resilient spring. This can help to improve reliability of pressure electrical contacts, as the carbon nanotube columns can compensate for irregularities or non-planarities in the probe card assembly 826 and/or DUT 822.

Figure 9:
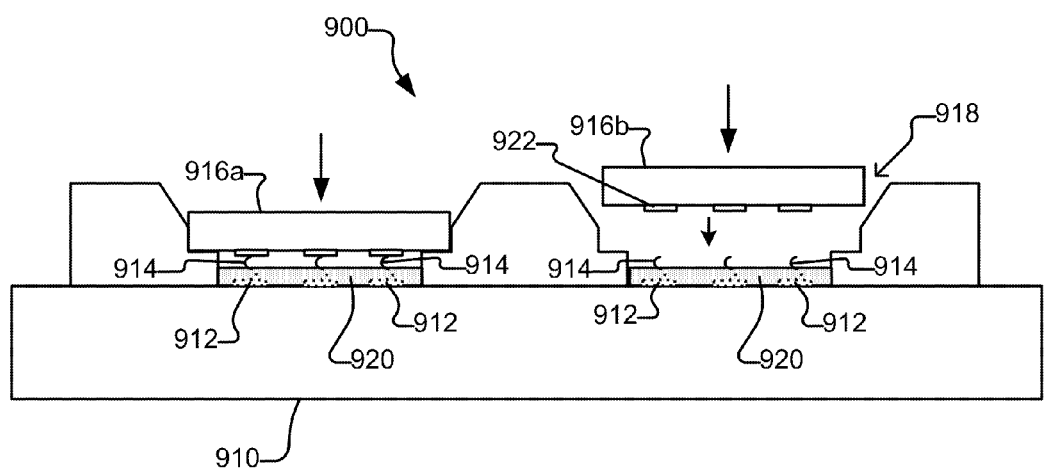
FIG. 9 is a side illustration of a socket in accordance with some embodiments of the invention.

FIG. 9 illustrates a socket 900 incorporating anchored carbon nanotube columns 914 in accordance with some embodiments of the invention. For example, the socket 900 can be a test socket into which dies 916a, 916b can be inserted for testing. The socket can comprise a substrate 910 have receptacles 918 which can receive dies 916a, 916b. Die 916a is shown fully inserted into a socket 918 and die 916b is shown in position to be inserted into a socket 918. Carbon nanotube columns 914 can make electrical connections to terminals 922 on the dies.

The carbon nanotube columns 914 can be disposed on the substrate 910 and anchored with filler material 920. For example, the carbon nanotube columns 914 can be like any of carbon nanotube columns 102, 202, 402 described above and filler materials 920 can be like any of filler material 106, 206, 406, 508 described above.

The carbon nanotube columns 914 can be disposed on and electrically connected to pads 912. The carbon nanotube columns 914 can function as resilient spring contacts, for example as described above. Traces (not shown) in or on substrate 910 can electrically connect pads 912 to each other, to electrical components (not shown) disposed on or in the substrate 910, and/or to other pads (not shown).

In some embodiments of the present invention, the use of carbon nanotube columns to provide contact elements can provide a number of advantages. For example, carbon nanotube columns can be resilient while maintaining high strength. When placed under a vertically-applied load (e.g., aligned with the length of the columns), carbon nanotube columns can provide a spring action while minimizing lateral displacement. This can enable very fine pitch spacing of the columns (e.g., spacing of 30 micrometers or less, or more particularly spacing of 25 micrometers or less, or even more particularly spacing of 20 micrometers or less).

In some embodiments of the present invention, carbon nanotube columns can be grown into high aspect ratio structures. For example, columns can have length to width ratios of 3:1, or more particularly length to width ratios of 10:1, or even more particularly length to width ratios of 25:1. In contrast, it is difficult to form high aspect ratio structures using conventional lithographic techniques.

In some embodiments of the present invention, carbon nanotube columns can also have highly rectangular cross sectional shapes, providing an almost ribbon-like shape. For example, cross-sectional dimensions can have ratios of less than 2:1, or more particularly less than 10:1, or even more particularly less than 100:1. Such shapes can be beneficial, for example, in providing low inductance contact structures.

In some embodiments of the present invention, the carbon nanotube columns can have varying dimensions. For example, width or cross-sectional diameter of the carbon nanotube columns can be less than 1 millimeter, or more particularly less than 200 micrometers, or even more particularly less than 25 micrometers.

Although specific embodiments and applications of the invention have been described in this specification, these embodiments and applications are exemplary only, and many variations are possible. Particular exemplary techniques for anchoring carbon nanotube columns have been disclosed, but it will be apparent that the inventive concepts described above can apply equally to alternate shapes and arrangements. Moreover, while specific exemplary processes for anchoring carbon nanotube columns have been disclosed, variations in the order of the processing steps, substitution of alternate processing steps, elimination of some processing steps, or combinations of multiple processing steps that do not depart from the inventive concepts are contemplated. Accordingly, the invention is not to be limited except as defined by the following claims.

We claim:

1. A method for anchoring carbon nanotube columns, the method comprising:
   providing a substrate with a plurality of carbon nanotube columns attached to a surface of the substrate;
   depositing a filler material onto the surface of the substrate and surrounding each of the columns;
   planarizing the filler material and the columns by removing a first portion of the filler material and portions of the columns; and
   etching away a second portion of the filler material to expose end portions of the columns, wherein a third portion of the filler material remains disposed on the surface of the substrate and portions of the columns, the third portion anchoring bases of the columns to the surface of the substrate.

2. The method of claim 1, wherein the planarizing comprises lapping the filler material and the ends of the columns.

3. The method of claim 1, wherein the planarizing is performed with respect to the surface of the substrate, and after the planarizing, lengths of the columns are substantially equal.

4. The method of claim 3, wherein the lengths of the columns are equal to within a tolerance of one micron.

5. The method of claim 1, wherein the depositing comprises bonding the filler material to the surface of the substrate, the filler material filling area on the surface of the substrate between the columns.

6. The method of claim 5, wherein the etching away the second portion comprises etching away the second portion such that the third portion that remains surrounds the bases and fills the area on the surface of the substrate between the columns.

7. The method of claim 6, wherein the etching away the second portion further comprises etching the second portion such that a thickness of the third portion on the surface of the substrate is less than three quarters of one of the lengths of the columns after the planarizing.

8. The method of claim 6, wherein the etching away the second portion further comprises etching the second portion such that a thickness of the third portion remaining on the surface of the substrate is less than half of one of the lengths of the columns after the planarizing.

9. The method of claim 6, wherein the etching away the second portion further comprises etching the second portion such that a thickness of the third portion remaining on the surface of the substrate is less than one third of one of the lengths of the columns after the planarizing.

10. The method of claim 6, wherein the etching away the second portion further comprises etching the second portion such that a thickness of the third portion remaining on the surface of the substrate is less than one quarter of one of the lengths of the columns after the planarizing.

11. The method of claim 1 further comprising disposing a dam on the surface of the substrate, the dam surrounding the columns, wherein the depositing the filler material comprises depositing the filler material within the dam.

12. The method of claim 1, wherein the filler material is a wet etchable lapping material.

13. The method of claim 1 further comprising:
bonding the end portions of the columns to a second substrate with a bonding material; and
releasing the columns from the filler material and the substrate.

14. The method of claim 1, wherein the providing a substrate comprises one of growing the columns on the substrate and transferring the columns to the substrate.

15. The method of claim 1, wherein the columns are attached directly by an adhesive to terminals and the terminals are attached directly to the surface of the substrate.

* * * * *